United States Patent [19]

Reid

[11] Patent Number: 5,766,983

[45] Date of Patent: Jun. 16, 1998

[54] TAPE AUTOMATED BONDING CIRCUIT WITH INTERIOR SPROCKET HOLES

[75] Inventor: W. Bruce Reid, Solana Beach, Calif.

[73] Assignee: Hewlett-Packard Company, Palo Alto, Calif.

[21] Appl. No.: 907,751

[22] Filed: Aug. 8, 1997

Related U.S. Application Data

[63] Continuation of Ser. No. 517,670, Aug. 22, 1995, abandoned, which is a continuation of Ser. No. 235,596, Apr. 29, 1994, abandoned.

[51] Int. Cl.$^6$ ............................ H01L 21/58; H01L 21/60; H01L 21/70
[52] U.S. Cl. .................... 438/107; 438/111; 438/113
[58] Field of Search ..................... 438/107, 111, 438/113

[56] References Cited

U.S. PATENT DOCUMENTS

| | | | |
|---|---|---|---|
| 3,843,911 | 10/1974 | Horton et al. | 257/668 |
| 3,967,366 | 7/1976 | Birglechner et al. | 437/206 |
| 4,426,773 | 1/1984 | Hargis | 437/206 |
| 4,792,532 | 12/1988 | Ohtani et al. | 257/668 |
| 4,801,561 | 1/1989 | Sankhagowit | 437/207 |
| 4,806,409 | 2/1989 | Walter et al. | 257/668 |
| 5,223,738 | 6/1993 | Okada | 257/668 |
| 5,355,018 | 10/1994 | Fierkens | 257/669 |

FOREIGN PATENT DOCUMENTS

| | | | |
|---|---|---|---|
| 213575 | 3/1987 | European Pat. Off. | 437/206 |
| 63-100738 | 5/1988 | Japan | 437/206 |
| 63-208233 | 8/1988 | Japan | 437/206 |
| 1-7529 | 1/1989 | Japan | 437/206 |
| 0263443 | 9/1992 | Japan | 257/668 |

*Primary Examiner*—David Graybill

[57] ABSTRACT

A process for manufacturing a tape automated bonding circuit with interior sprocket holes including: a substrate; at least one conductor deposited on the substrate; a functional area on the substrate defined by a polygon surrounding the conductor with all sides of the polygon adjacent to a segment of the conductor and with interior angles of the polygon between the sides of the polygon greater or equal to ninety degrees and having at least one sprocket hole within the functional area on the substrate. The sprocket hole is used to engage and drive the tape automated bonding circuit through processing steps. In a specific embodiment the functional area on the substrate has a first set of two sprocket holes within the functional area, which are used to engage and drive the tape automated bonding circuit through processing steps. In an alternate specific embodiment the substrate has a second set of two sprocket holes in the substrate, which are used to engage and drive the tape automated bonding circuit through processing steps. In another specific embodiment, the length between the first set of sprocket holes and the second set of sprocket holes divided into the length of the substrate is an integer.

6 Claims, 5 Drawing Sheets

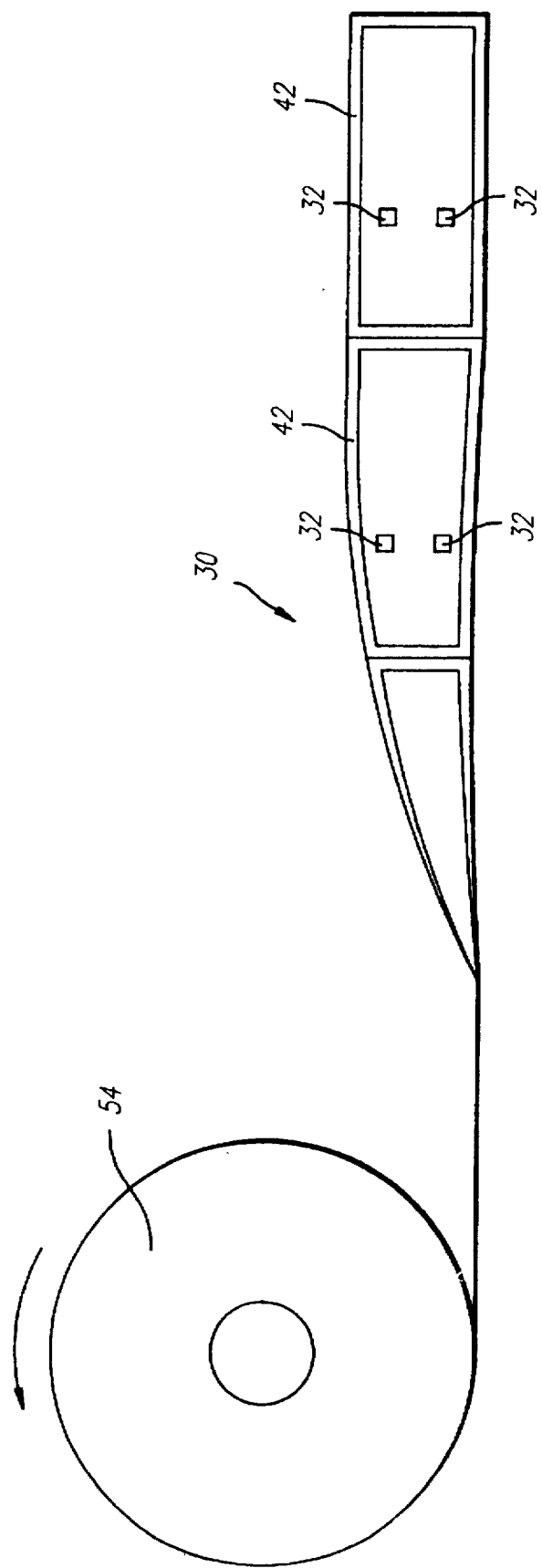

TAPE AUTOMATED BONDING CIRCUIT WITH INTERIOR SPROCKET HOLES

CROSS REFERENCE TO RELATED APPLICATION(S)

This is a continuation of application Ser. No. 08/517,670 filed on Aug. 22, 1995, now abandoned, which is a continuation of Ser. No. 08/235,596, filed Apr. 29, 1994, abandoned.

BACKGROUND OF THE INVENTION

1. Field of the Invention

This invention relates to tape automated bonding and more particularly to tape automated bonding (TAB) circuits.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

2. Description of the Related Art

Tape automated bonding (TAB) circuits are used for many applications including integrated circuit packaging and interconnection to thermal inkjet printheads. TAB circuits are fabricated by plating copper or gold conductors, bond pads and circuit traces onto a polyimide substrate. The processing to construct a TAB circuit is automated and the machines for processing a TAB circuit are expensive.

The fabrication process for TAB circuits begins with polyimide material that is driven through processing steps that plate conductors onto the polyimide material. After fabrication, the TAB circuits are driven through tape automated bonding processes that attach the TAB circuit to bonding pads on an integrated circuit or a thermal inkjet printhead.

Conventionally, sprocket holes are placed on strips of the polyimide substrate on either side of the TAB circuit functional area, which is the area of the polyimide substrate onto which conductors are plated. The sprocket holes are used to engage and drive the polyimide material through the tape automated bonding processing steps and provide alignment for assembly processes. Tooling holes can also be provided in the TAB circuit for aligning the TAB circuit for assembly processes that follow TAB circuit fabrication.

Conventionally, TAB circuits are fabricated in parallel in an array that can contain as many as two to twenty or more strings of TAB circuits in parallel. FIG. 1 shows an array of three strings of TAB circuits in parallel. In FIG. 1, TAB circuit functional areas alternate with sprocket holes across the array. In the interior of the array, sprocket holes for one TAB circuit are directly adjacent to sprocket holes for another TAB circuit. This leads to a very inefficient use of the machinery, because the sprocket holes take up valuable area that is not available for use for functional areas with conductors.

After fabrication, the array of parallel substrates is split apart and each string of TAB circuits is put on a reel. This reel of TAB circuits is then mounted onto machinery that performs the tape automated bonding process that attaches the TAB circuit to bonding pads on an integrated circuit or a thermal inkjet printhead. The sprocket holes on each side of the TAB circuit are used to engage and drive the polyimide material through the tape automated bonding processing steps.

The sprocket holes on each side of the polyimide material result in added cost and inefficient processing. For example, a typical conventional TAB circuit with sprocket holes may be one inch wide, as shown in FIG. 2. The functional area of the TAB circuit in FIG. 2 is only three fourths of an inch wide; thus, the sprocket holes in the conventional TAB circuit consume one fourth of the available area of the polyimide material, which results in a twenty five percent inefficiency for fabricating TAB circuits. The sprocket holes serve no functional purpose in a finished TAB circuit, so the area of the TAB circuit required for these holes is wasted. If the sprocket holes were not along the edge of the TAB circuit, then more TAB circuits could be processed on the same machinery in the same period of time and productivity would significantly improve.

Accordingly, there is a need in the art for a TAB circuit without sprocket holes along both edges that reduces cost and improves TAB circuit fabrication productivity.

SUMMARY OF THE INVENTION

The need in the art is addressed by an improved tape automated bonding circuit with interior sprocket holes. The invention includes a substrate and at least one conductor deposited on the substrate. A functional area on the substrate is defined by a polygon surrounding the conductor with all sides of the polygon adjacent to a segment of the conductor and with interior angles of the polygon between the sides of the polygon greater or equal to ninety degrees. At least one sprocket hole is provided interior to the functional area on the substrate. The sprocket hole is used to engage and drive the polyimide material through the processing steps in the fabrication of the TAB circuit.

In a specific embodiment the improved tape automated bonding circuit with interior sprocket holes further includes a first set of two sprocket holes in the functional area on the substrate, which are used to engage and drive the tape automated bonding circuit through processing steps.

In an alternate specific embodiment the substrate has a second set of two sprocket holes in the substrate, which are used to engage and drive the tape automated bonding circuit through processing steps.

In another specific embodiment, the length between the first set of sprocket holes and the second set of sprocket holes divided into the length of the substrate is an integer.

In an alternate specific embodiment a substrate includes an M by N array of rectangular tape automated bonding circuits with at least one conductor deposited on each of the rectangular tape automated bonding circuits. The invention includes a rectangular functional area on each of the rectangular tape automated bonding circuits defined by a rectangle surrounding the conductor deposited on each of the rectangular tape automated bonding circuits with all sides of the rectangle adjacent to a segment of the conductor. Each of the rectangular functional areas interior to the M by N array of rectangular tape automated bonding circuits is closely bordered by at least two other rectangular functional areas in the M dimension of the M by N array of rectangular tape automated bonding circuits. At least a first set of two sprocket holes are provided within each of the rectangular functional areas. The two sprocket holes of the first set are aligned to each other in the M dimension of the M by N array of rectangular tape automated bonding circuits. The set of sprocket holes is used to engage and drive the TAB circuit through processing steps.

The improved tape automated bonding circuit with interior sprocket holes reduces cost and improves TAB circuit fabrication and assembly productivity.

BRIEF DESCRIPTION OF THE DRAWINGS

FIG. 5 is an illustrative diagram showing a string of improved TAB circuits with interior sprocket holes on a reel according to the present invention.

DESCRIPTION OF THE INVENTION

The advantageous design and operation of the present invention and illustrative embodiments and exemplary applications will now be described with reference to the accompanying drawings.

Figure 1:
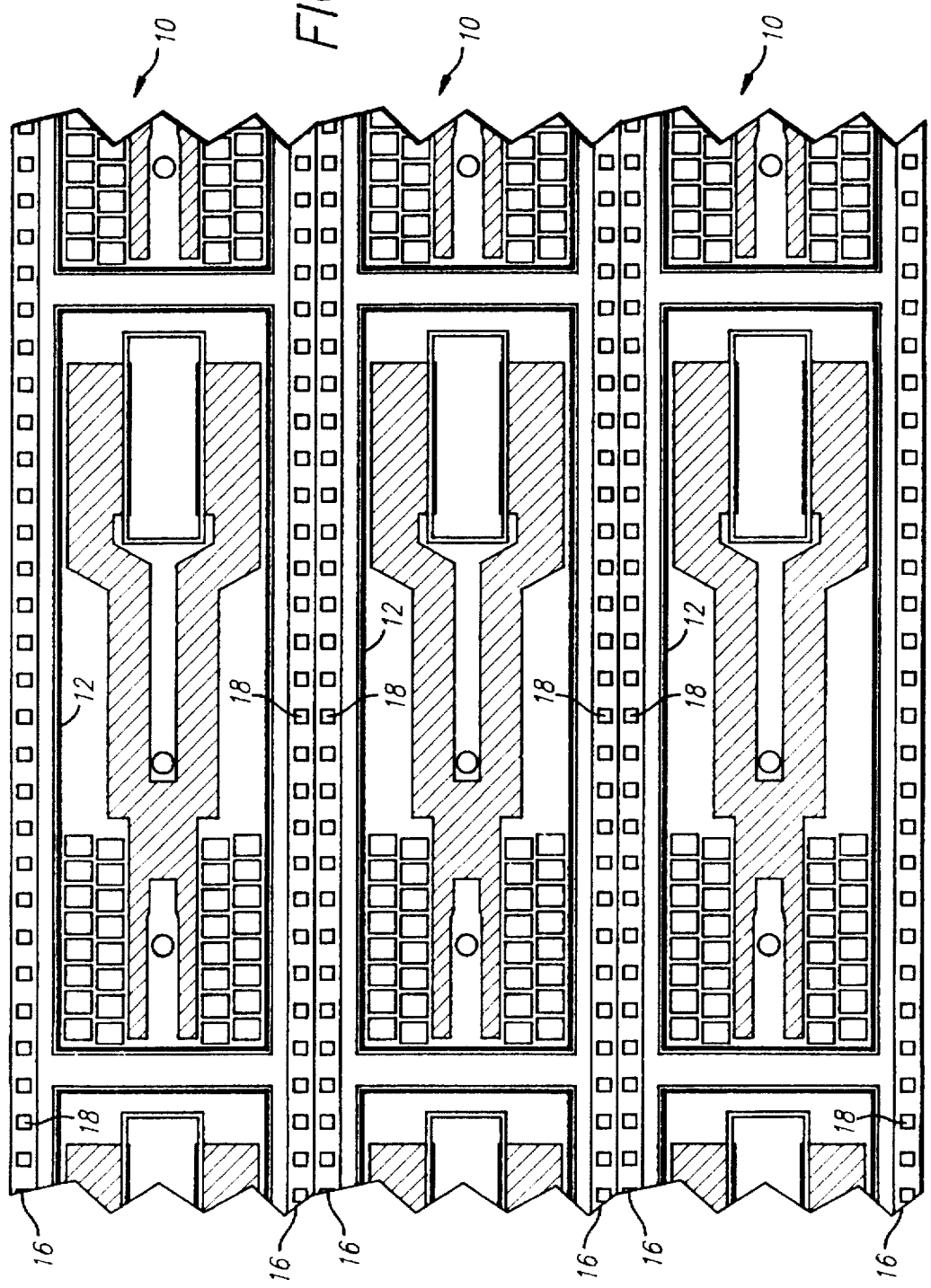
FIG. 1 is an illustrative diagram showing an array of parallel strings of conventional sprocketed TAB circuits.

Conventionally, TAB circuits are fabricated in parallel in an array that might contain as many as two to twenty or more strings of TAB circuits in parallel. FIG. 1 shows an array of three strings of TAB circuits in parallel. After fabrication the array of parallel strings is split into individual strings of TAB circuits. Each string of TAB circuits repeats a TAB circuit many times along the length of the string. A string of TAB circuits is put onto a reel and driven through tape automated bonding processes.

Figure 2:
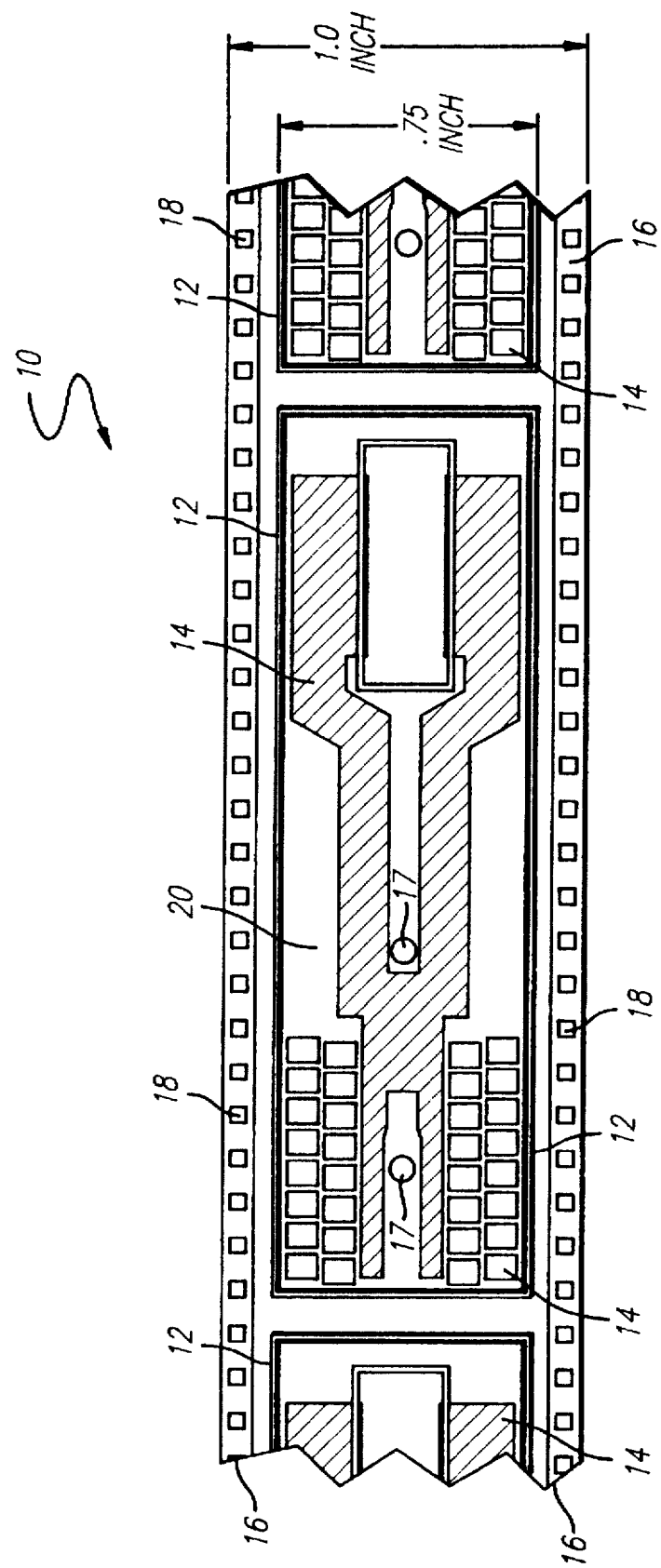
FIG. 2 is an illustrative diagram showing a string of conventional sprocketed TAB circuits.

FIG. 2 shows one string of conventional sprocketed TAB circuits 10. As shown, a conventional sprocketed TAB circuit 10 is formed on a polyimide substrate 20. Functional areas 12 on the polyimide substrate contain conductors 14. Sprocket holes 18 are provided on both sides of the functional area 12 along the sprocketed rails 16. The sprocket holes 18 are used to engage and drive the TAB circuit 10 through the tape automated bonding processes that attach the TAB circuit to bonding pads on an integrated circuit or thermal inkjet printhead. As shown in FIG. 2, a conventional TAB circuit may also have tooling holes 17 that are used for alignment during assembly processes.

In FIG. 1, TAB circuit functional areas 12 alternate with sprocket holes 18 across the parallel array of TAB circuit strings. Interior to the parallel array, two sets of sprocket holes 18 are directly adjacent to one another. This leads to a very inefficient use of the fabrication machinery, because the sprocket holes take up valuable area that is not available for use for functional areas with conductors.

As an example of the inefficiency of a conventional TAB circuit, FIG. 2 shows the overall width of a conventional sprocketed TAB circuit 10 as being one inch. The functional area 12 in FIG. 2 of the conventional sprocketed TAB circuit 10 is only three fourths of an inch wide; thus, the sprocket holes in the conventional TAB circuit consume one fourth of the available area of the polyimide material. The sprocket holes serve no functional purpose in a finished TAB circuit, so the area of the TAB circuit required for these holes is wasted, which results in increased processing and material costs.

Figure 3:
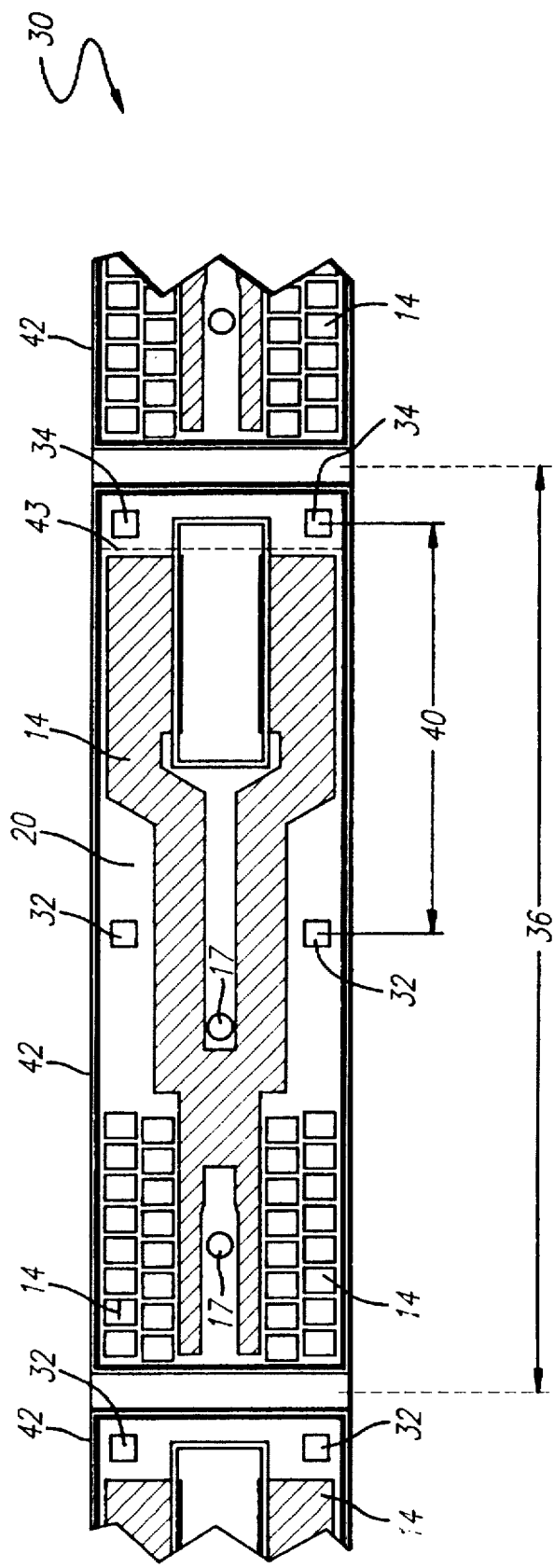
FIG. 3 is an illustrative diagram showing an improved string of TAB circuits with interior sprocket holes according to the present invention.

FIG. 3 is a string of TAB circuits with interior sprockets 32 according to the present invention. Each TAB circuit provides conductors 14 on a polyimide substrate 20, as in a conventional TAB circuit. For the TAB circuit of the present invention, the functional area 42 is defined by a polygon surrounding the conductors 14 with all sides of the polygon adjacent to a segment of a conductor 14 and with the interior angles of the polygon between the sides of the polygon greater or equal to ninety degrees. In FIG. 3 the polygon that defines the functional area is a rectangle 42, which is bounded at one end by a line 43. The line 43 is transverse to the conductors 14.

Figure 4:
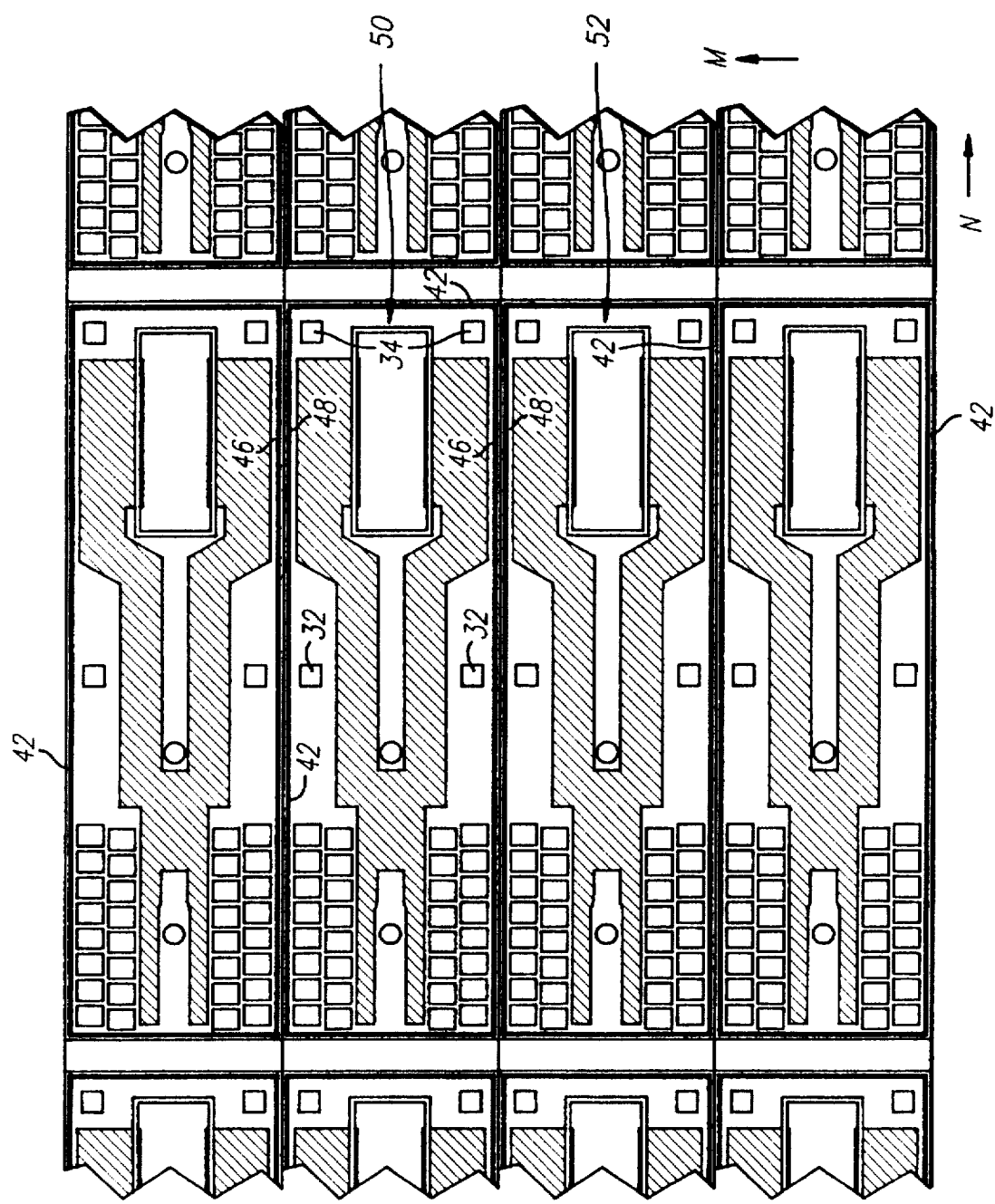
FIG. 4 is an illustrative diagram showing an array of parallel strings of improved TAB circuits with interior sprocket holes according to the present invention.

The string of TAB circuits can be processed in a parallel array of TAB circuit strings, as shown in FIG. 4. The parallel array forms an M by N array of TAB circuits. No sprocket holes are needed on either side of the functional area 42. This saves a significant amount of material and improves productivity. More TAB circuits can be processed in parallel improving the efficiency of the machinery producing the TAB circuits.

As shown in FIG. 4, the functional areas 42 of the present invention are closely adjacent to one another. For example, an edge 46 of the functional area 42 of a TAB circuit 50 is directly adjacent to an edge 48 of the functional area 42 of a TAB circuit 52 in the M dimension of the array. The conventional array of TAB circuits has intervening sprocket holes 18 along the sprocketed rails 16 between the functional areas 12, as shown in FIG. 1.

In the present invention at least one sprocket hole 32 is located in the functional area 42 of the substrate 20 and is used to drive the TAB circuits through the fabrication processing steps. A set of two sprocket holes can be provided and each sprocket hole in a set is aligned with the other sprocket hole in the set along the M dimension of the array, as shown in FIG. 4. More than one set of sprocket holes can be spaced along the tape automated bonding circuit substrate length 36 in the N dimension, as shown in FIG. 4 and the spacing between sets of sprocket holes when divided into the tape automated bonding circuit substrate length 36 is an integer. For example, as shown in FIG. 3, the sprocket holes 32 and 34 are spaced along a substrate length 36. The tape automated bonding circuit substrate length 36 divided by the spacing 40 between sprocket holes 32 and 34 is the integer two. The sets of sprocket holes could also be spaced along the tape automated circuit substrate length 36 with a non-integer spacing.

In FIG. 3, the sprocket holes 34 are outside the functional area 42, which is bounded by the line 43. However, the sprocket holes 34 are within each rectangular tape automated bonding circuit substrate length that is repeated in an M by N array in FIG. 4.

In the conventional TAB circuits of FIGS. 1 and 2, all of the sprocket holes 18 are outside of the functional area as defined by the above functional area definition.

After fabrication of the parallel array of TAB circuit strings, as shown in FIG. 4, the strings are split apart for tape automated bonding processes and put on a reel. FIG. 5 shows a TAB circuit string 30 on a reel 54 with sprocket holes 32 within the functional areas 42.

The improved tape automated bonding circuit with interior sprocket holes reduces cost and improves TAB circuit fabrication and assembly productivity. Thus, the present invention has been described herein with reference to a particular embodiment for a particular application. Nonetheless, those having ordinary skill in the art and access to present teachings will recognize additional modifications, applications, and embodiments within the scope thereof. For example, the polyimide substrate of the present invention may be replaced by other materials without departing from the scope of the present invention.

It is therefore intended by the appended claims to cover any and all such applications, modifications and embodiments within the scope of the present invention.

Accordingly,

What is claimed is:

1. A method performed on a tape automated bonding (TAB) circuit comprising the steps of:

provautomatic a strip of insulating material having a width and a length, said length being substantially longer than said width, said strip having two parallel outer edges running along said length;

providing sprocket holes in said strip next to and along each of said two outer edges for engagement with sprocket teeth used to engage and drive said strip in a lengthwise direction through various processing steps in the fabrication of said TAB circuit, said sprocket holes residing completely within a first distance from the closest outer edge of said strip;

providing a repeated pattern of conductive material on said strip, each said repeated pattern of conductive material being formed over at least a center portion of said strip, each said repeated pattern of conductive material forming conductive traces having first terminations for attachment to bonding pads of an electrical device, said first terminations being located proximate to a first end of each said repeated pattern, said conductive traces having second terminations being located proximate to a second end of each said repeated pattern, opposite to said first end, wherein said pattern repeats along said length of said strip, a portion of conductive material in each said repeated pattern extending closer to an outer edge of said strip than said first distance so as to extend beyond an edge of said sprocket holes;

engaging said sprocket holes with said sprocket teeth to position said strip with respect to said electrical device having said bonding pads formed thereon for connection of said bonding pads to ends of said conductive traces formed on said strip;

bonding terminals of said electrical device, for each said repeated pattern, to said first terminations while said sprocket holes next to and along each of said two outer edges are engaged with said sprocket teeth; and cutting said strip in a widthwise direction perpendicular to said outer edges of said strip separate individual TAB circuits from one another, but not cutting said strip in a lengthwise direction, whereby said outer edges of said strip are retained throughout the entire processing of said TAB circuit to reduce wasting of said insulating material.

2. The method of claim 1 wherein each of said individual TAB circuits has at least a first set of two sprocket holes, said two sprocket holes arranged transverse to said length of said strip.

3. The method of claim 2 wherein each of said individual TAB circuits also has a second set of two sprocket holes arranged transverse to said length of said strip.

4. The method of claim 3 wherein the distance between said first set of two sprocket holes and said second set of two sprocket holes divided into the length of each of said individual TAB circuits is an integer.

5. The method of claim 1 wherein said electrical device is a printhead.

6. The method of claim 1 wherein said electrical device is an integrated circuit.

* * * * *